United States Patent
Wanior et al.

(10) Patent No.: US 11,515,462 B2
(45) Date of Patent: Nov. 29, 2022

(54) FINISHED CONDUCTOR ARRANGEMENT FOR AN NB3SN SUPERCONDUCTOR WIRE AND METHOD FOR PRODUCING A SUBELEMENT FOR AN NB3SN SUPERCONDUCTOR WIRE

(71) Applicant: Bruker EAS GmbH, Hanau (DE)

(72) Inventors: Matheus Wanior, Gelnhausen (DE); Vital Abaecherli, Erlensee (DE); Carl Buehler, Langenselbold (DE); Bernd Sailer, Alzenau (DE); Klaus Schlenga, Karlsruhe (DE); Manfred Thoener, Biebergemuend (DE); Michael Field, Hoboken, NJ (US)

(73) Assignee: BRUKER EAS GMBH, Hanau (DE)

( * ) Notice: Subject to any disclaimer, the term of this patent is extended or adjusted under 35 U.S.C. 154(b) by 0 days.

(21) Appl. No.: 17/492,920

(22) Filed: Oct. 4, 2021

(65) Prior Publication Data
US 2022/0029084 A1  Jan. 27, 2022

Related U.S. Application Data

(63) Continuation of application No. PCT/EP2020/059382, filed on Apr. 2, 2020.

(30) Foreign Application Priority Data

Apr. 5, 2019  (DE) ..................... 10 2019 204 926.5

(51) Int. Cl.
  *H01L 39/24* (2006.01)
  *H01F 6/06* (2006.01)
(52) U.S. Cl.
  CPC ............. *H01L 39/248* (2013.01); *H01F 6/06* (2013.01); *H01L 39/2409* (2013.01)

(58) Field of Classification Search
  CPC .......................... H01L 39/2409; H01L 39/248
  See application file for complete search history.

(56) References Cited

U.S. PATENT DOCUMENTS

| 5,534,219 A | 7/1996 | Marancik et al. |
| 7,368,021 B2 | 5/2008 | Field et al. |
| (Continued) | | |

FOREIGN PATENT DOCUMENTS

| CN | 105913967 A | 8/2016 |
| DE | 102012218222 A1 | 4/2014 |
| (Continued) | | |

OTHER PUBLICATIONS

Barzi et al., "Performance of Nb3Sn RRP Strands and Cables Based on a 108/127 Stack Design", Fermilab PUB-06-298-TD, Aug. 2006, 4 pages.

*Primary Examiner* — Paul A Wartalowicz
(74) *Attorney, Agent, or Firm* — Edell, Shapiro & Finnan, LLC

(57) ABSTRACT

For producing an Nb3Sn superconductor wire, restack rod process (RRP) subelements (1*a*; 60*a*) are grouped to form a bundle having an approximately circular cross section and are arranged together with filling elements (18*a*-18*c*) in an internally and externally round outer tube (19; 52). To the inside the filling elements form a serrated profile (25) for abutment against the hexagonal subelements, and to the outside they form a round profile (24) for direct or indirect abutment in the outer tube. In fabricating the RRP subelements, and before a reshaping with a reduction in cross section, an externally hexagonal and internally round casing structure (9) is provided, into which the remaining parts of the subelements are inserted, in particular, an annular arrangement of hexagonal Nb-containing rod elements (4), (Continued)

which are surrounded externally by an outer matrix (7, 61) and internally by an inner matrix (3).

27 Claims, 9 Drawing Sheets

(56) References Cited

U.S. PATENT DOCUMENTS

| | | |
|---|---|---|
| 7,585,377 B2 | 9/2009 | Field et al. |
| 9,330,819 B2 | 5/2016 | Schlenga |
| 9,741,471 B2 | 8/2017 | Thoener et al. |
| 2005/0178472 A1 | 8/2005 | Hong et al. |
| 2008/0167192 A1 | 7/2008 | Kato et al. |
| 2012/0108437 A1 | 5/2012 | Ohata et al. |
| 2014/0096997 A1 | 4/2014 | Schlenga |
| 2014/0287929 A1 | 9/2014 | Thoener |
| 2017/0221608 A1* | 8/2017 | Field .................... B21C 37/047 |
| 2018/0068766 A1* | 3/2018 | Smathers ............... H01B 12/06 |

FOREIGN PATENT DOCUMENTS

| | | |
|---|---|---|
| EP | 2099080 A1 | 9/2009 |
| EP | 2779258 B1 | 9/2014 |
| EP | 3062359 A1 | 8/2016 |
| JP | 2007524210 A | 8/2007 |

\* cited by examiner

FINISHED CONDUCTOR ARRANGEMENT FOR AN NB3SN SUPERCONDUCTOR WIRE AND METHOD FOR PRODUCING A SUBELEMENT FOR AN NB3SN SUPERCONDUCTOR WIRE

CROSS REFERENCE TO RELATED APPLICATIONS

This is a Continuation of International Application PCT/EP2020/059382, which has an international filing date of Apr. 2, 2020, and the disclosure of which is incorporated in its entirety into the present Continuation by reference. In addition, the present Continuation claims the benefit of and priority to German patent application 10 2019 204 926.5, filed Apr. 5, 2019. The entire content and disclosure of this German patent application is also incorporated by reference into the present Continuation.

FIELD OF THE INVENTION

The invention relates to a finished conductor arrangement for an Nb3Sn superconductor wire, comprising
- a plurality of mutually abutting subelements each comprising Nb and Sn and each being configured hexagonally in external cross section, and
- an outer structure which comprises Cu and which surrounds the mutually abutting subelements, the outer structure being configured to be round in external cross section, where the subelements are each configured with
- an Sn-containing core,
- an inner matrix which comprises Cu and which surrounds the Sn-containing core,
- a region of mutually abutting Nb-containing rod elements, which are each configured hexagonally in external cross section, more particularly where the Nb-containing rod elements are each configured with an Nb-containing core filament and a Cu-containing filament casing, and
- an outer matrix which comprises Cu and surrounds the region of Nb-containing rod elements. A finished conductor arrangement of this kind has been disclosed, for example, by U.S. Pat. No. 7,585,377 B2.

BACKGROUND

Superconductor materials are able to carry electrical current with virtually no ohmic losses, and are used, for example, to construct magnetic coils with which particularly high magnetic field strengths can be generated.

One important superconductor material, particularly for the construction of magnetic coils, is Nb3Sn. Since Nb3Sn is not amenable to plastic deformation, the production of an Nb3Sn superconductor wire usually involves first the fabrication of a preliminary conductor which comprises Nb and Sn, typically with Cu as matrix material. The preliminary conductor is processed to a finished conductor by reshaping with a tapering in cross section, and bundling. This finished conductor is usually subjected again to reshaping with a tapering in cross section, and then brought into a desired geometry, by the winding of a coil, for instance. Subsequently, in a reactive heat treatment, the superconducting Nb3Sn phase is generated, so turning the finished conductor into the completed Nb3Sn superconductor wire. The production of an Nb3Sn superconductor wire is therefore a multistage operation which is difficult overall. Here, a number of routes have developed, which exhibit considerable differences in their approach and in the reactions that take place and that are relevant to the quality of the completed Nb3Sn superconductor wire.

In the case of what is called the bronze route, the Sn which is to react with the Nb of the preliminary conductor is provided in the preliminary conductor via a bronze matrix. The bronze route is comparatively simple to perform, but the Sn content of the bronze matrix limits the formation of the Nb3Sn phase.

In the case of the internal tin route, a source of tin is disposed in the preliminary conductor, usually centrally, and in the reactive heat treatment the Sn from the core is reacted with the Nb of the preliminary conductor through the Cu matrix. In the case of an approach according to the powder-in-tube principle (abbreviated to PIT), Sn-containing powder is arranged in a small tube made of Nb or of Nb alloy. The filled Nb tubelet is arranged in a Cu-containing sheath, possibly fabricated with a hexagonal external cross section, to give a PIT element. The PIT elements with their hexagonal external cross section are drawn and bundled, and can be surrounded with filling elements, which on the outside have a circular arc shape and on the inside are profiled to match the hexagonally profiled PIT elements, and are arranged in a stabilizing Cu casing tube. In the reactive heat treatment, the Sn in the PIT core reacts directly with the encasing Nb tube. One typical PIT process is described, for example, by EP 3 062 359 B1. A similar approach is described by EP 2 779 258 B1.

The internal tin route may also take place in accordance with the restack rod process principle (abbreviated to RRP). In this case a multiplicity of hexagonal Nb filaments (also called Nb-containing rod elements), typically each comprising an Nb rod and a surrounding Cu filament casing, are annularly bundled and surrounded inside and outside by a Cu matrix. Arranged in the interior is a center comprising Sn, and on the outside a diffusion barrier and a round Cu casing are arranged. Subelements configured in this way are drawn to a hexagonal external cross section, bundled, and surrounded—for the formation of a wire—by a copper matrix; cf. U.S. Pat. No. 7,585,377 B2. The bundling of round RRP subelements in a tubular sheath has also been disclosed by DE 10 2012 218 222 A1. With the RRP process, it is possible to achieve usually particularly high superconducting current-carrying capacities on the part of a completed Nb3Sn superconductor wire.

In practice, when a relatively large number of RRP subelements are to be grouped in a wire—at least 54 subelements, for example—the copper matrix for the wire (or finished conductor) is fabricated with a round outer shape and a hexagonal inner shape, and the subelements, bundled accordingly into a hexagonal shape, are inserted into this inner shape. If the finished conductor is then subjected again to reshaping with a tapering in cross section, outer subelements, especially those near to the corners of the hexagonal inner shape, undergo deformation, in some cases to a considerable extent. Instances of such deformation can be recognized, for example, in E. Barzi et al., "Performance of Nb3Sn RRP Strands and Cables Based on a 108/127 Stack Design", FERMILAB-PUB-06-298-TD, 4MW06, in FIG. 1 therein. These deformations jeopardize the desired course of the reactive heat treatment in the subelement in question, and so in this subelement no Nb3Sn, or less Nb3Sn than desired, develops, and the current-carrying capacity drops accordingly. There is a risk, moreover, of Sn from the deformed subelement propagating in an uncontrolled manner, into the copper matrix of the wire or into the Cu casings of other subelements, for instance, with the possible consequence of an increase in the electrical resistance of the copper in the wire (low RRR) and therefore a possible detrimental effect on its protective function for avoiding or diminishing a sudden, irreversible loss of superconduction in a completed magnet (quenching).

In the reshaping of the RRP subelements, which are initially round in external cross section, to a hexagonal external cross section, as well, the interior of the subelement undergoes uneven deformation. In particular, Nb material of the Nb filaments may be displaced radially outward toward the corners of the hexagon, with the consequence that during the reactive heat treatment, because of the relatively large distance from the Sn source located in the center of the subelement, the supply of Sn is no longer sufficient and/or is delayed, and the expensive Nb is no longer able to contribute to the superconducting current-carrying capacity. Moreover, the uneven deformations (for instance, the thinning of a diffusion barrier) may also result in the possibility of Sn from the subelement penetrating into unwanted regions during the reactive heat treatment, such as into the region of the local Cu casing (also call Cu casing structure) or else of Cu casings of adjacent subelements, with the consequence there of an increase in the ohmic resistance and hence of a detrimental effect on the protective function. A further possible consequence of the uneven deformation is that precursor materials intended for the formation of Nb3Sn (rod elements and, where appropriate, barriers) after reshaping come into contact (filament bridging) or lie too close to one another. This hinders the uniform diffusion of Sn into the formerly singularized Nb precursor material and/or causes a local alteration in the composition of the conductor. Accordingly, during the heat treatment, there can be no complete and stoichiometric formation of Nb3Sn, and this significantly reduces the maximum attainable current-carrying capacity. At the same time, the mutual contacting of precursor materials impairs the mechanical properties of the conductor during reshaping with a possible consequence of wire breaks.

A more specific variant of a finished conductor for an Nb3Sn superconductor wire envisages the bundling of NbCu rods and Cu rods with NaCl filling in a Cu jacket. The NaCl is flushed out with water and replaced by Sn; cf. U.S. Pat. No. 5,534,219 A.

SUMMARY

It is an object of the invention to provide a finished conductor for an Nb3Sn superconductor wire, with which it is possible to achieve a superconducting current-carrying capacity that is high for the conductor cross section. It is a further, related object to provide such a finished conductor with which it is possible to reduce the risk of Sn contamination of protective copper fractions.

These and other objects are achieved in accordance with one formulation of the invention by a finished conductor arrangement of the type stated at the outset, wherein the outer structure is configured with an outer tube which is configured to be round in external cross section and internal cross section, wherein, between the outer tube and the mutually abutting subelements, one or more filling elements are arranged which radially to the outside have a round profile for direct or indirect abutment against an inside of the outer tube, and which radially to the inside have a serrated profile for abutment against the mutually abutting subelements, and wherein the entirety of the filling elements, radially toward the inside, form an approximately circular overall profile.

With the finished conductor of the invention it is possible to obtain an Nb3Sn-containing superconductor wire on the RRP principle, having a particularly high Nb3Sn content and hence a current-carrying capacity which is particularly large (for the cross-sectional area of the Nb3Sn superconductor wire). At the same time it is possible here to avoid Sn contamination of the outer structure, especially the outer tube, and also of external matrices of the subelements, with a high degree of reliability.

In the context of the present invention, one or more filling elements are abutted on the outside to the mutually abutting subelements. As a result, a circular outer profile is formed which can be abutted directly or indirectly to the cross-sectionally circular inside of the outer tube (by way of one or more intermediate structures, which are likewise configured circularly in their cross section, usually, on the inside and the outside). Furthermore, radially inwardly, the filling elements form an inner profile which, though serrated, is nevertheless approximately circular overall; against this inner profile, the mutually abutting hexagonal subelements are abutted.

Hereby, it is possible firstly to avoid cavities in the finished conductor, especially between the inside of the outer tube (or of an innermost intermediate structure) and the outer profile of the entirety of the mutually abutting subelements. Secondly it is possible to avoid pronounced corners (as would be present in the case of a conventional outer profile, approximately hexagonal overall, of the mutually abutting subelements) for the mutually abutting subelements.

Using the filling elements provided in the invention and the approximately circular arrangement of the subelements in accordance with the invention, it is possible to reduce or minimize uneven deformations at the subelements when the finished conductor is reshaped with a reduction in cross section. In the context of the invention, all of the subelements are able to reduce their cross section largely uniformly, in particular with approximate retention of all wall thickness proportions over their respective entire periphery. There are no local subelements with particular deformation, at pronounced corners, for instance. Correspondingly, the diffusion lengths envisaged for reactive annealing are retained, and any diffusion barriers that have been set up are not damaged. The reactive annealing after the reshaping of the finished conductor with a reduction in cross section is able to proceed undisrupted, achieving a high current-carrying capacity and avoiding instances of Sn contamination into those regions of the Nb3Sn subconductor wire that are highly conductive in the normal conduction state (and which have a protective function in the event of quenching).

Note that in order to set up the approximately circular outer profile of the entirety of the mutually abutting subelements, and, respectively, the corresponding approximately circular inner profile of the entirety of the form elements, there are preferably at least 40, more preferably at least 60 subelements, and very preferably at least 80 subelements, grouped in the finished conductor. The outer profile of the entirety of the mutually abutting subelements is approximately circular in particular when the smallest possible circle containing the tips projecting radially the furthest of the entirety of the mutually abutting subelements would no longer be able, between the containing circle and the outside of the entirety of the mutually abutting subelements, to completely accommodate any further subelements of the same size.

The internally and externally circular outer tube is particularly cost-effective and simple to produce. The one or more filling elements are likewise comparatively cost-effective to produce, especially if they cover in each case only a small part of the periphery of the round profile of the entirety of the filling elements—for example, a partial peripheral angle of 45° or less; the filling elements may, for example, starting from solid material, be milled and/or profile-rolled into long lengths. The finished conductor arrangement comprises preferably at least two, more preferably at least 6, very preferably at least 12 filling elements.

Preferred embodiments of the finished conductor

One preferred embodiment of the finished conductor of the invention is that wherein the finished conductor arrangement comprises a plurality of filling elements, and wherein tips projecting radially furthest of the entirety of the mutually abutting subelements combine with the round profiles of the filling elements to form a circular contour, with the filling elements being configured such that the circular contour has a minimal radius. This enables a particularly high degree of filling (areal fraction in the cross section) of the finished conductor arrangement with subelements, and hence a particularly high degree of filling of the subsequent, completed Nb3Sn superconductor wire with Nb3Sn. With this design, the furthest-projecting tips of the mutually abutting subelements separate off filling elements which converge there from one another in the peripheral direction.

An alternative, advantageous embodiment is that wherein the one or more filling elements form a surrounding filling element ring within which the entirety of the mutually abutting subelements are arranged, more particularly where the condition for a minimal radial wall thickness $WS_{min}$ of the filling element ring is as follows: $WS_{min} \geq 0.3*KL_{sub}$, where $KL_{sub}$ is the edge length of a hexagonal subelement. Through the surrounding ring of filling elements it is possible to take on functional or structural tasks with this ring; a corresponding, separate intermediate structure for the same task is unnecessary. In particular, in the plastic deformation between the outer structure (or a part thereof) and the mutually abutting subelements, the filling elements are able to compensate, or to form an ohmic current pathway available surroundingly (for which purpose they may be fabricated from elemental Cu), or else to serve as a diffusion barrier (for which purpose they may be fabricated, for example, from Nb, Ta or V).

A preferred development of this embodiment is that wherein the filling element ring comprises a plurality of filling elements, and wherein joints between filling elements adjacent in the peripheral direction in the filling element ring extend at least partially, preferably completely, diagonally with respect to the radial direction, more particularly where the condition for a smallest length of extent $VL_{min}$ of all the lengths of extent of the respective joints is as follows: $VL_{min} \geq 2*WS_{min}$, where $WS_{min}$ is the minimal radial wall thickness of the filling element ring. With diagonal joints it is possible to retard diffusion of impurities, for instance Sn, along the joints (corresponding to the lengthening of the diffusion pathway along the joint). With preference it is also the case that $VL_{min} \geq 4*WS_{min}$. Alternatively, joints extending in a radial direction may also be provided, and are particularly easy to fabricate.

One preferred embodiment is that wherein the one or more filling elements comprise Cu. Copper in the filling elements enables good reshaping properties, and is comparatively cost-effective. Moreover, in the event of quenching, Cu may serve for electrical stabilization and may therefore afford a protective function. For this purpose the filling elements usually contain 50 wt % of Cu or more, and more particularly the filling elements may consist of elemental Cu.

An alternative development of the embodiment with a surrounding ring of filling elements is that wherein the filling elements of the filling element ring are fabricated from a material which is suitable for blocking or hindering the diffusion of Sn from the subelements into the outer tube during a reactive heat treatment wherein the Nb and Sn from the subelements react to form Nb3Sn, more particularly where the filling elements comprise Nb, Ta and/or V. As a result, the outer structure of the finished conductor arrangement is protected against contamination with Sn, and for the outer structure, especially the outer ring, it is possible to ensure a high RRR and hence a good protective function in the event of quenching. For this purpose the filling elements typically contain at least 50 wt % of Nb, Ta and/or V, in order to block the diffusion of Sn. Otherwise, a material may be considered to be blocking or hindering for the diffusion of Sn if the rate of diffusion of Sn through this material is at most 1/10 of the rate of diffusion through the material of the outer tube, based on a temperature range from room temperature to 800° C. (corresponding to the maximum range of a typical reactive heat treatment).

A preferred embodiment is that wherein the finished conductor arrangement comprises a plurality of filling elements having different geometries, more particularly where there are a total of twelve filling elements having two different geometries. By using different geometries (architectures) of the filling elements it is usually possible to achieve a greater degree of filling of the finished conductor with subelements. In practice, usually 2, 3 or 4 different geometries are sufficient.

A preferred embodiment is that wherein an intermediate structure, more particularly an intermediate tube, is present radially between the inside of the outer tube and the round profiles of the one or more filling elements. With the intermediate structure it is possible to address a structural or functional task, for example a compensation between the plastic deformation properties of the outer tube and of the mutually abutting subelements, or the provision of a surrounding ohmic current pathway, or else the provision of a diffusion barrier.

A preferred development of this embodiment is that wherein the intermediate structure is fabricated from a material which is suitable for blocking or hindering the diffusion of Sn from the subelements into the outer tube during a reactive heat treatment wherein the Nb and Sn from the subelements react to form Nb3Sn, more particularly where the intermediate structure comprises Nb, Ta and/or V.

Typically in this case the intermediate structure comprises at least 50 wt % of Nb, Ta and/or V, in order to block the diffusion of Sn. Otherwise, a material may be regarded as blocking or hindering for the diffusion of Sn if the rate of diffusion of Sn through this material is at most 1/10 of the rate of diffusion through the material of the outer tube, based on a temperature range from room temperature to 800° C. (corresponding to the maximum range of a typical reactive heat treatment). By blocking Sn using the intermediate structure it is possible to ensure a high RRR and hence a good protective function in the event of quenching in the outer tube.

A further preferred embodiment is that wherein the subelements are additionally configured with a diffusion barrier, which radially surrounds the outer matrix, and a casing structure which comprises Cu and which radially surrounds the diffusion barrier. With the diffusion barrier of the subelements, it is possible to prevent penetration of Sn into the local casing structure or else into the casing structure of an adjacent subelement, and ultimately also into the region of the filling elements or of the outer structure of the finished conductor arrangement. In that case there is no need for a diffusion barrier in the region of the outer structure (although such a barrier may also be provided for additional reliability).

A preferred embodiment is that wherein in the finished conductor arrangement there is a central structure which is surrounded by the mutually abutting subelements, where the central structure is Cu-containing, more particularly where the central structure comprises one or more central elements which are configured hexagonally in external cross section. With the Cu-containing central structure it is possible to improve the reshaping characteristics. Central elements which are hexagonal in cross section can be bundled particularly easily together with the subelements.

The scope of the present invention also encompasses a method for fabricating an $Nb_3Sn$-containing superconductor wire, comprising:

subjecting a finished conductor arrangement of the invention, described above, to a reshaping with a reduction in cross section;

bringing the reshaped finished conductor arrangement into a desired geometric form, more particularly by winding it to form a coil;

subjecting the finished conductor arrangement, brought into form, to a reactive heat treatment wherein the Nb and Sn from the subelements react to form Nb3Sn. By this method it is possible in a simple way to fabricate an Nb3Sn-containing superconductor wire (also simply called Nb3Sn superconductor wire) which has a high current-carrying capacity, and for which instances of Sn contamination of regions which are highly conductive (in the normal conduction state) can be largely avoided.

A particularly preferred variant of the method described above is that wherein the subelements are configured with a casing structure which comprises Cu and against which the outer matrix is abutted directly or indirectly radially on the inside, wherein, for fabricating a respective subelement for the finished conductor arrangement, the casing structure is fabricated separately with a round internal cross section and a hexagonal external cross section, and the remaining parts of the subelement are subsequently inserted into the round internal cross section of the casing structure, and wherein the respective subelements are subjected to a reshaping with a reduction in cross section and are bundled to form a finished conductor arrangement of the invention, described above. As a result of the separately fabricated casing structure with hexagonal external cross section and round internal cross section, the reshaping of the subelement with a reduction in cross section does not give rise to any uneven deformations on the subelement, and, accordingly, evenly deformed subelements can be obtained which after reactive annealing have a high areal fraction of Nb3Sn, and in which radially outward diffusion of Sn (as a result, for instance, of damage to diffusion barriers or local reductions in wall strength) is minimized (in this regard, see the further method of the invention below, including its variants). It is possible, moreover, to reduce filament bridging, thereby further improving the maximum attainable superconducting current-carrying capacity and the reshaping properties.

Method for producing a subelement for an Nb3Sn superconductor wire

The scope of the present invention further embraces a method for producing a subelement for an Nb3Sn superconductor wire, where the subelement comprises Nb and Sn and is configured hexagonally in external cross section, and where the subelement is configured with an Sn-containing core, an inner matrix which comprises Cu and which surrounds the Sn-containing core, a region of mutually abutting Nb-containing rod elements, which are each configured hexagonally in external cross section, more particularly where the Nb-containing rod elements are each configured with an Nb-containing core filament and a Cu-containing filament casing, an outer matrix which comprises Cu and surrounds the region of Nb-containing rod elements, a casing structure which comprises a Cu and against which the outer matrix abuts directly or indirectly radially on the inside, characterized in that the casing structure is fabricated separately with a round internal cross section and a hexagonal external cross section, and in that the remaining parts of the subelement are subsequently inserted into the round internal cross section of the casing structure.

In the context of the present invention the concept is not to obtain a hexagonal outer form to the subelements by imposing a hexagonal outer form on an initially round subelement simultaneously with a shaping with reduction in cross section—utilizing, for instance, an appropriately shaped drawing die. Instead, the present invention, in the fabrication of RRP subelements, envisages fabricating an (outer) casing structure having a hexagonal external cross section and a round internal cross section, and then inserting the remaining parts of the subelement into the round internal cross section, so that in the course of a shaping with reduction in cross section, the hexagonal outer form can then simply be retained.

If a hexagonal outer form is imposed by reshaping on an initially round subelement, such as in U.S. Pat. No. 7,585,377 B2, column 7, lines 24-28, for example, the internal structure is distorted in the process. In particular, material from the interior of the subelement is displaced in the direction of the hexagon corners, with removal of material close to the longitudinal sides of the hexagon. In relation to diffusion paths of Sn from the core of the subelement, the regions close to the longitudinal sides of the hexagon provide the shortest diffusion paths. During reactive annealing it is then necessary to adjust operation to these regions with the shortest diffusion paths, in order to prevent complete runaway reaction of the Nb-containing region of the mutually abutting Nb-containing rod elements, and/or to prevent radial propagation of Sn into the outer matrix or even into the casing structure. As a result, a large amount of expensive Nb material which has been shifted into the region close to the hexagon corners as a result of the reshaping operation is not reached by Sn during reactive annealing, and is therefore unable to make any contribution to the superconducting current-carrying capacity. In many cases, even a slight inhomogeneity may mean that the thinning of the mutually abutting Nb-containing rod elements or of a diffusion barrier near to the longitudinal sides of the hexagon becomes locally so great that there is local contamination (for instance, into the local outer matrix and the local casing structure, and possibly also into the casing structures of adjacent subelements) with Sn, so causing at least locally a massive increase in the resistance (with normal conduction), and so impairing the protective function in the event of quenching.

In contrast to this, the invention envisages furnishing the subelement originally (prior to the first reshaping with reduction in cross section) with a casing structure having a hexagonal external cross section. The remaining parts of the subelement are inserted into this casing structure, in a round internal cross section. When this composite subelement is subjected to reshaping with reduction in cross section, the hexagonal outer form can be retained. Correspondingly, the reshaping with reduction in cross section is then very even. All wall thickness proportions can be approximately retained, in particular over their respective entire periphery. There are no subregions of a subelement that exhibit sharp local differences in deformation, such as, for instance, at the hexagon corners in relation to the flat sides of the hexagon (and this also reduces the susceptibility to inhomogeneities). Correspondingly, the diffusion lengths provided for reactive annealing are retained overall, and any diffusion barriers that have been set up are not damaged. The reactive annealing after the reshaping, with reduction in cross section, of the finished conductor comprising the subelements is able to take place undisrupted, and a high current-carrying capacity is achieved, and instances of Sn contamination in regions of high conductivity (under normal conduction) are avoided.

The more even deformation of this subelement in the course of a reshaping with reduction in cross section also ensures that the Nb-containing rod elements present in the subelement as part of the RRP operation of the invention are deformed overall with a greater degree of radial uniformity, and in particular are not deformed to different extents to one another at different sites in the peripheral direction. In the event of such unevenly deformed Nb-containing rod elements, there could after reactive annealing be increased instances of the phenomenon of filament bridging. Bridge connections of this kind in the cross section of the superconductor reduce the current-carrying capacity, since homogeneous and stoichiometric formation of Nb3Sn is made more difficult in the inhomogeneously deformed regions of the subelement. The superconducting regions formed in this way also have locally larger cross sections, thereby facilitating the induction of superconducting circulating currents (e.g., on use in a magnet). Both the more difficult formation of Nb3Sn and the simplified accommodation of induced circulating currents drastically impair the maximum achievable current-carrying capacity after heat treatment. In the context of the invention, this filament bridging can be considerably reduced, since the subelement constituents intended for Nb3Sn formation can remain insulated over long sections and hence an increase in the current-carrying capacity is achievable that goes considerably beyond the effect of a larger utilizable Nb3Sn areal fraction in the finished conductor arrangement. At the same time, the reshaping properties can be improved through the avoidance of connecting Nb rod elements; the risk of breaks is reduced.

Note that the Nb-containing rod elements preferably each have a (typically Nb-free) filament casing, the minimal radial wall thickness of which is preferably at least 0.025 times, preferably at least 0.075 times, the diameter of an Nb-containing core filament; in that case, filament bridging can be kept in check with particular efficiency.

Note also that in the case of powder-in-tube processes, no singularized Nb3Sn zones are generated in individual PIT elements, since in that case, instead of Nb-containing rod elements abutting one another annularly, an Nb-containing tube is used which from the start cannot be altered in its homogeneity by uneven reshaping and which after reactive annealing still has a large coherent areal region of Nb3Sn.

Preferred variants of the method for producing a subelement

One preferred method variant is that wherein at least the inner matrix, the region of mutually abutting Nb-containing rod elements and the outer matrix are first assembled into a unified insert part, and this unified insert part is inserted into the round internal cross section of the casing structure. The use of a unified insert part simplifies and accelerates the method of the invention. An alternative possibility is also to insert different parts individually and in succession into the round internal cross section of the casing structure, and/or parts inserted previously.

An advantageous variant is that wherein the subelement is fabricated with a diffusion barrier which radially surrounds the outer matrix and which is abutted directly or indirectly against the casing structure radially on the inside. With the diffusion barrier, which is typically tubular in configuration, it is possible to minimize or prevent radial emergence of Sn from the Sn-containing core into the local casing structure or even into the casing structures or external matrices of adjacent subelements. The diffusion barrier may be fabricated, for example, from Nb, Ta or V, more particularly with at least 50 wt % of Nb, Ta and/or V.

A preferred development of the two variants above is that wherein the unified insert part also comprises the diffusion barrier. This further simplifies the method. Alternatively, the diffusion barrier can also be first inserted on its own into the internal cross section, and then an insert part can be inserted into the diffusion barrier arranged in the internal cross section.

Another development is that wherein the unified insert part also comprises the Sn-containing core. This as well further simplifies the method. Alternatively, the inserted part can also be first inserted into the internal cross section, and then the Sn-containing core can be inserted into the insert part arranged in the internal cross section.

The scope of the present invention, furthermore, also embraces a method for producing an Nb3Sn-containing superconductor wire, comprising:
fabricating a plurality of subelements in accordance with the invention, as described above;
subjecting the fabricated subelements to a reshaping with reduction in cross section;
bundling the reshaped subelements to form a finished conductor arrangement, where a plurality of reshaped subelements are placed against one another and are surrounded by a Cu-containing outer structure;
subjecting the finished conductor arrangement to a reshaping with reduction in cross section;
bringing the reshaped finished conductor arrangement into a desired geometric form, more particularly by winding to form a coil;
subjecting the finished conductor arrangement, brought into form, to a reactive heat treatment wherein the Nb and Sn from the subelements react to form Nb3Sn. The Nb3Sn superconductor wire fabricated in this way experiences virtually no distortions in the subelements during the reshaping of the subelements with reduction in cross section, and is able to utilize a particularly high areal fraction of Nb3Sn, and to achieve a particularly high current-carrying capacity, where additionally it is possible to prevent or reduce filament bridging, so further increasing the current-carrying capacity and improving the reshaping properties. Moreover, the risk of Sn contaminations is reduced.

A preferred variant of this method for producing an Nb3Sn superconductor wire is that wherein during the bundling to form the finished conductor arrangement, one or more filling elements are arranged between the outer structure, which comprises an outer tube having a round internal cross section and a round external cross section, and the mutually abutting subelements, where the filling elements radially outward have a round profile for direct or indirect abutment against an inside of the outer tube, and radially inward have a serrated profile for abutment against the mutually abutting subelements, and where the entirety of the filling elements radially toward the inside form an approximately circular overall profile. As a result, uneven deformation of subelements during the reshaping of the finished conductor arrangement, with reduction in cross section, can be avoided or at least reduced, so that the reactive heat treatment (reactive annealing) is able to proceed correctly in all of the subelements. In particular, deformations of outerlying subelements in the finished conductor arrangement can be avoided or reduced; the formation of pronounced corners in the entirety of the subelements, which are particularly susceptible to uneven dents, is avoided. As a result, in the completed Nb3Sn superconductor wire, the superconducting current-carrying capacity is increased and the risk of Sn contaminations is reduced.

Further advantages of the invention are apparent from the description and the drawing. Similarly, the features identified above and those set out further below can be used in accordance with the invention in each case individually on their own or as two or more thereof in any desired combinations. The embodiments shown and described should not be understood to be a conclusive listing, but instead are illustrative in nature for the outlining of the invention.

DETAILED DESCRIPTION

FIGS. 1 to 7 illustrate schematically the entire production of an Nb3Sn superconductor wire in the context of the invention, where not only a) the subelement is put together, in accordance with the invention, from an externally hexagonal and internally round casing structure and from the remaining parts of the subelement, but also b) one or (preferably) two or more filling elements in the finished conductor arrangement is or are arranged between the entirety of the mutually abutting subelements and the inside of an outer tube. Note, however, that the invention can be realized through the utilization of just one of the aspects, a) or b).

Figure 1:
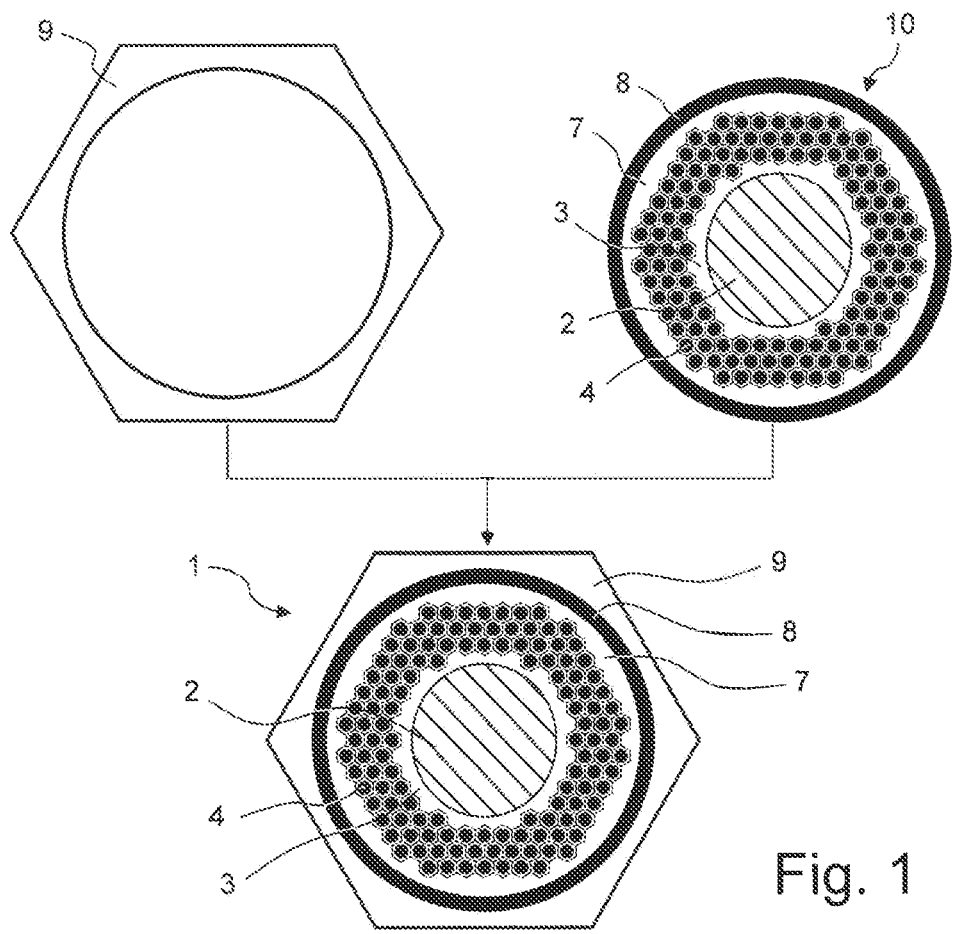
FIG. 1 shows schematically the production of a subelement for an Nb3Sn superconductor wire composed of a casing structure and other parts of the subelement according to the invention, in cross-sectional views.

FIG. 1 shows, in a schematic cross-sectional representation, the production—in accordance with the invention—of a subelement 1 for an Nb3Sn superconductor wire of the invention.

The subelement 1—see the bottom part of FIG. 1—comprises an Sn-containing core 2, which comprises, for example, a powder of elemental Sn, and is typically circular in configuration. The Sn-containing core 2 is surrounded by an inner matrix 3 which comprises Cu. Arranged around the inner matrix 3 are a multiplicity of Nb-containing rod elements 4. The Nb-containing rod elements 4 each have a hexagonal external cross section and are configured so as to abut one another and to surround the inner matrix 3 annularly.

Figure 2:
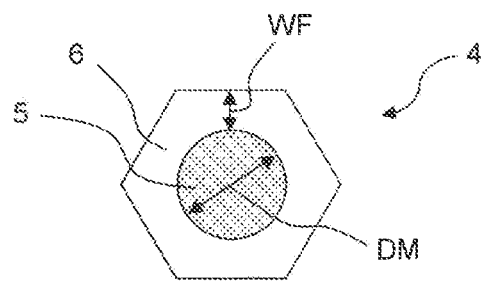
FIG. 2 shows in a schematic cross section, illustratively, an Nb-containing rod element for the invention.

In the embodiment shown, the Nb-containing rod elements 4 each have an Nb-containing core filament 5 (usually a round rod of elemental Nb or of an alloy with 50 wt % or more of Nb) and a Cu-containing filament casing 6 (usually made of elemental Cu or of an alloy containing 50 wt % or more of Cu); cf. FIG. 2. The filament casing 6 is preferably free from Nb, but may, for example, contain some Sn or other additions for improving or establishing the diffusion behavior in the course of reactive annealing. The condition presently for the smallest radial wall thickness WF of the filament casing 6 and for the largest diameter DM of the core filament 5 is around WF=0.36*DM; generally preferred is WF≥0.15*DM or even WF≥0.25*DM.

Referring again to FIG. 1, the Nb-containing rod elements 4 are surrounded in turn by an outer matrix 7 comprising Cu. The outer matrix 7 possesses a round outer profile. In the embodiment shown, the outer matrix 7 is surrounded by a diffusion barrier 8, which is fabricated from Nb, for example. This barrier blocks any Sn from the core 2, which might penetrate into the outer matrix 7 during reactive annealing, in a radial direction. The diffusion barrier 8 has a uniform wall thickness and is externally round in configuration.

The diffusion barrier 8 is surrounded in turn by a casing structure 9 which comprises Cu and is typically fabricated from elemental copper or from an alloy with at least 50 wt % of Cu. The casing structure 9 possesses a round internal cross section and a hexagonal external cross section.

For the fabrication of the subelement 1, the casing structure 9 is fabricated separately, and even at this stage is configured with a hexagonal external cross section and a round internal cross section. The remaining parts of the subelement 1 are inserted into the round internal cross section, or into the interior of the casing structure 9. Preferably here, as shown in FIG. 1, at least the inner matrix 3, the Nb-containing rod elements 4 and the outer matrix 7 are first assembled to form a unified insert part 10, after which the unified insert part 10 is inserted into the casing structure 9.

In the embodiment shown, the unified insert part 10 also comprises the Sn-containing core 2 and the diffusion barrier 8, and so all of the remaining parts of the subelement 1 are inserted together into the casing structure 9. Alternatively, however, it would also be possible, for example, for the diffusion barrier 8 first to be inserted on its own into the casing structure 9, and then for the insert part 10 to be inserted into the diffusion barrier 8; similarly, the Sn-containing powder core 2 could be introduced into the insert part 10 only after the insertion of the insert part 10 into the casing structure 9 (in each case, not shown in any more detail).

Figure 3:
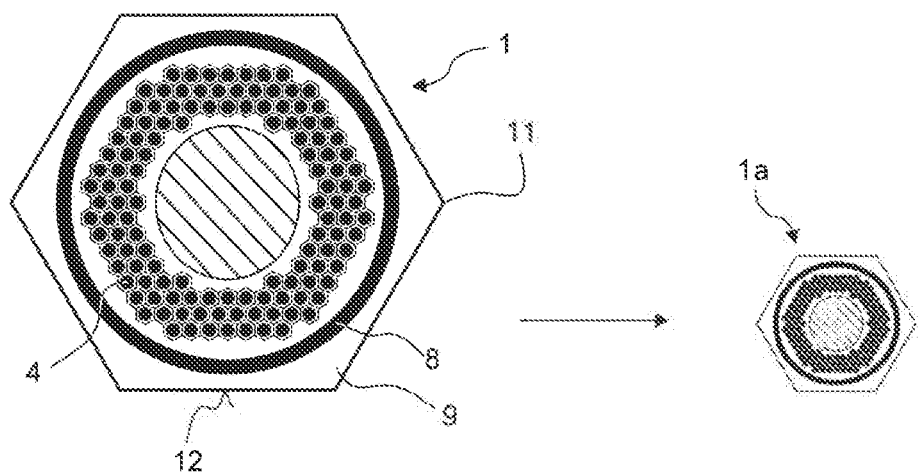
FIG. 3 shows schematically a reshaping with reduction in cross section of the subelement of FIG. 1 according to the invention.

The subelement 1 thus fabricated is then subjected to reshaping with a reduction in cross section, as shown in FIG. 3. In this procedure, the outer form can be retained; there is only a proportional reduction in the cross section in the reshaped (for instance, drawn) subelement 1a, which thus also has a hexagonal external cross section. Insofar as material is redistributed within the cross-sectional plane, this redistribution is only radial, and in particular is not azimuthal; the main redistribution of material takes place in the axial direction (in the "drawing direction", perpendicular to the plane of the cross sections shown). In particular, the arrangement of the Nb-containing rod elements 4 is not forced into a hexagonal form, and there is no thinning, for instance, of the diffusion barrier 8 close to the longitudinal sides 12 of the hexagon. The wall thickness proportions remain the same over the entire periphery. Moreover, the Nb-containing rod elements 4 retain their relative position in the subelement 1/1a, and in particular are not pressed flat locally or pressed onto other Nb-containing rod elements 4.

Figure 4:
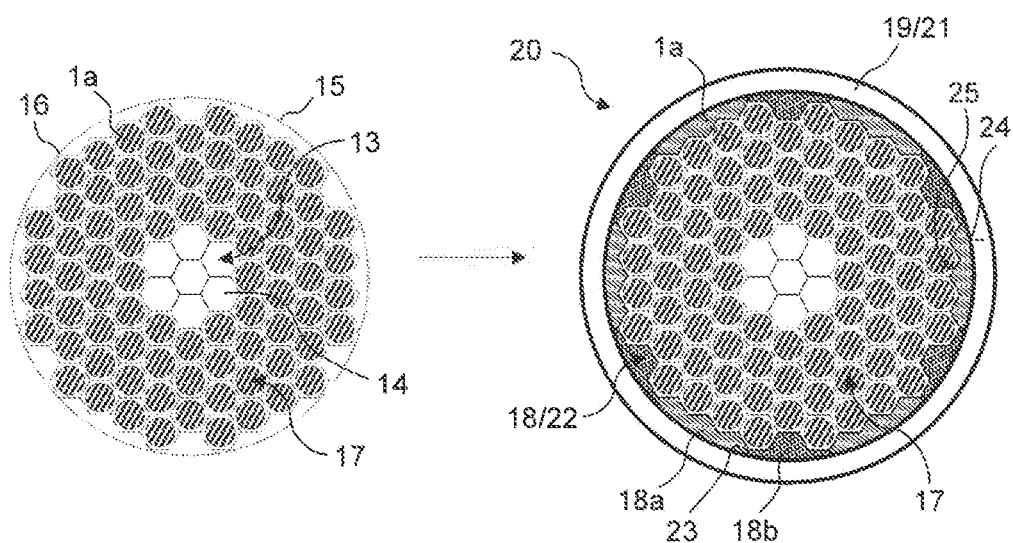
FIG. 4 shows schematically the production of a finished conductor arrangement according to the invention, in cross-sectional views.

Then a plurality of drawn subelements 1a are bundled, as shown on the left in FIG. 4. In this case the drawn subelements 1a are shown, for simplification, as hexagons with a hatched circle.

In the variant shown, there are 78 subelements 1a arranged here abutting one another, with a central structure 13 being set up not with subelements 1a, but instead with in this case seven hexagonal central elements 14. The central elements 14 contain Cu (and are fabricated, for example, from elemental Cu or from a Cu alloy containing at least 50 wt % of Cu).

Radially on the outside, the entirety 17 of the subelements 1a form an approximately circular overall profile; in particular, within an (imaginary) circumscribing circle 15 (depicted with dots), which runs through the tips 16 of the subelements 1a which project the furthest radially, it is not possible anywhere to add a further subelement radially externally to the entirety 17 of the subelements 1a, without that further, added subelement lying at least partly outside the circumscribing circle 15.

Subsequently, in order to fabricate a finished conductor arrangement 20—cf. FIG. 4, right—a plurality of filling elements 18a, 18b are abutted on the outside against the subelements 1a; in the variant shown, there are two geometries (types) of filling elements 18a, 18b, with the two geometries 18a, 18b alternating in the peripheral direction. In total here there are twelve filling elements 18a, 18b used.

The filling elements 18a, 18b have a round profile 24 radially toward the outside, and a serrated profile 25 radially toward the inside. The serrated profile 25 corresponds to the locally adjoining outer contour of the entirety 17 of the subelements 1a.

The entirety 18 of the filling elements 18a, 18b form a surrounding circular profile radially toward the outside. Radially toward the inside, the entirety 18 of the filling elements 18a-18b form approximately a circular overall profile, corresponding to the overall outer profile of the entirety 17 of the subelements 1a.

Arranged around the filling elements 18a, 18b is an outer tube 19. In the variant shown, the filling elements 18a, 18b directly abut a round inside of the outer tube 19 by their round profiles 24. The outer tube 19 here forms the outer structure 21 of the finished conductor arrangement 20. The outer structure 21 comprises Cu, preferably at least 50 wt % of Cu; for this purpose, in the embodiment shown, the outer tube 19 is fabricated from elemental Cu. Toward its outside, the outer tube 19 likewise has a round configuration.

In the variant shown, the entirety 18 of the filling elements 18a, 18b form a closed, surrounding ring 22 of filling elements, with the filling elements 18a, 18b adjoining one another and there forming short, radially extending joints 23 in each case. The filling elements 18a, 18b are fabricated here from Cu or from a Cu-containing alloy containing at least 50 wt % of Cu, and so the filling elements 18a, 18b and also the outer tube 19 can serve as ohmic current diversion pathways in the event of quenching (a sudden loss of superconduction) in order to protect the subsequent Nb3Sn superconductor wire. An intermediate structure made from material which blocks the diffusion of Sn is unnecessary here, as the individual subelements 1a have already been furnished with diffusion barriers (cf. FIG. 1, ref. 8).

Figure 5:
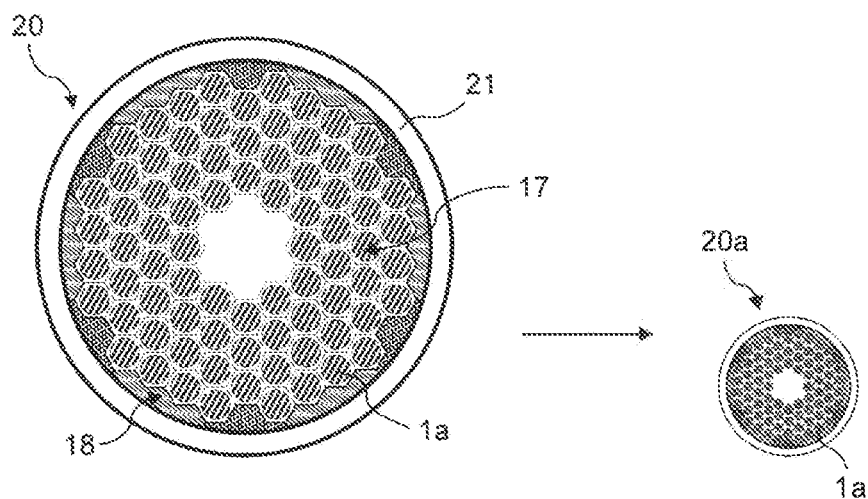
FIG. 5 shows schematically a reshaping with reduction in cross section of the finished conductor arrangement of FIG. 4 according to the invention.

When the entirety 17 of the subelements 1a and the entirety 18 of the filling elements 18a, 18b have been arranged in the outer structure 21, the finished conductor arrangement 20 undergoes reshaping with a reduction in cross section; cf. FIG. 5. In this operation there is again only a proportional reduction in the cross section in the reshaped (for instance, drawn) finished conductor arrangement 20a. Because the filling elements 18a, 18b do not leave any significant free spaces, and the entirety 18 of the filling elements 18a, 18b and the entirety 17 of the subelements 1a are substantially rotationally symmetrical in their construction, redistributions of material in the cross-sectional plane are substantially uniformly radial, and in particular are not azimuthal; the main redistribution of material in this case takes place in the axial direction (in the "drawing direction", perpendicular to the plane of the cross sections shown). In particular, no individual subelements 1a are particularly dented; instead, all of the subelements undergo substantially the same, proportional reduction in their cross-sectional area. In the subelements 1a there is no local thinning of the diffusion barrier, for instance, and nor is there any local compression of Nb-containing rod elements 4 in the subelements 1a. The wall thickness proportions remain approximately the same over the entire periphery of a respective subelement for all of the subelements 1a.

Figures 6, 7:
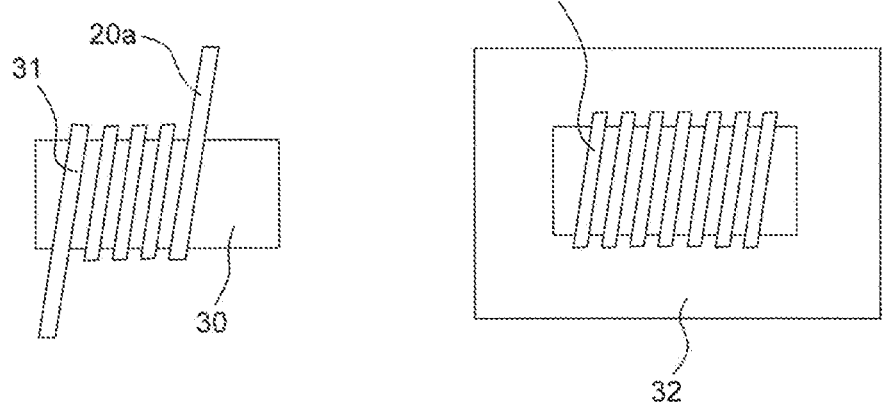
FIG. 6 shows schematically the winding of a coil with the reshaped finished conductor arrangement according to the invention.
FIG. 7 shows schematically the reactive annealing of the coil of FIG. 6, to give a superconducting coil of Nb3Sn superconductor wire, according to the invention.

The reshaped (for instance, drawn) finished conductor arrangement 20a obtained in this way can then be brought into a form desired for use, by being wound, for instance, into a coil 31 on a winding body 30, as shown in FIG. 6. If desired, twisting and/or stranding of reshaped finished conductor arrangements 20a may also take place beforehand for example (not shown in any more detail).

Subsequently, the finished conductor arrangement 20a which has been brought into the desired form, in this case the coil 31, is subjected to a reactive heat treatment (also called reactive annealing), for which typically it is arranged in an oven 32; cf. FIG. 7. The reactive heat treatment typically provides for a plurality of heat treatment stages (temperature plateaus at which a constant temperature is maintained for a certain time, usually a number of hours), such as a temperature plateau of around 210° C., a further temperature plateau of around 350° C.-400° C., and a temperature plateau of around 650-750° C. During the heat treatment, Sn from the Sn-containing cores of the subelements diffuses to the Nb-containing rod elements of the subelements, and Nb3Sn is formed; in other words, the reshaped finished conductor arrangement 20a brought into the desired form becomes an Nb3Sn superconductor wire 33. This process entails the formation of Nb3Sn zones which are dictated by the subelements and the Nb-containing rod elements, which are separated wholly or partly from one another in cross section, which are able in each case to carry current superconductingly along their longitudinal axis (direction of extent of the wire), and which overall are able to carry a current of particularly high current strength superconductingly.

Figure 8:
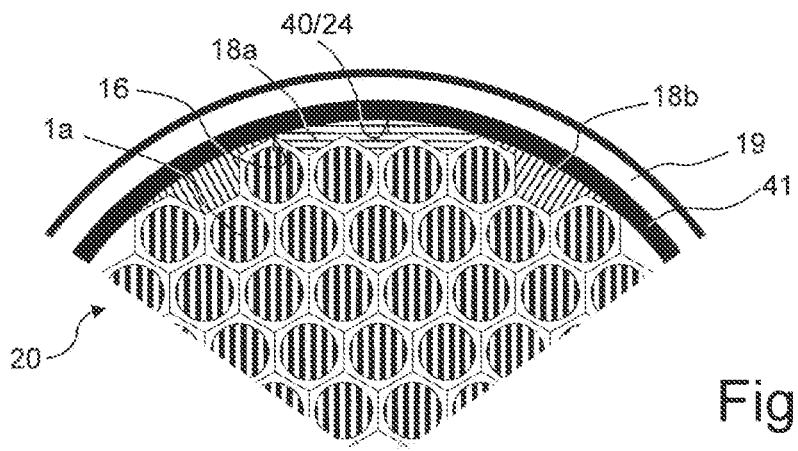
FIG. 8 shows schematically in cross section a detail of a finished conductor arrangement according to the invention, with subelements abutting an intermediate structure.
Figure 9:
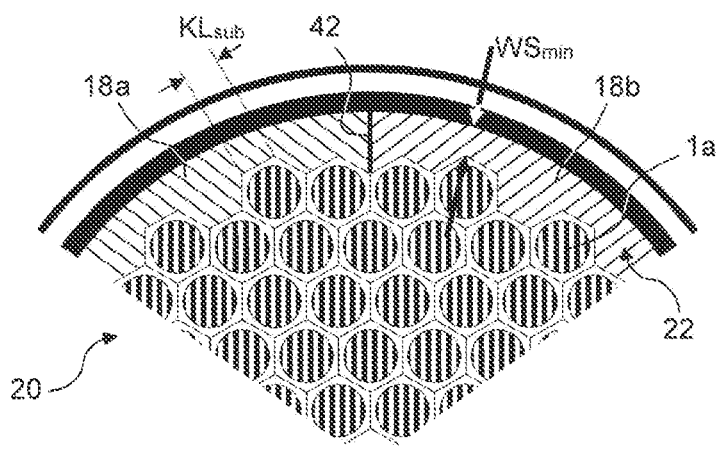
FIG. 9 shows schematically in cross section a detail of a finished conductor arrangement according to the invention, with filling elements which form a closed ring of filling elements, with radially extending joints.
Figure 10:
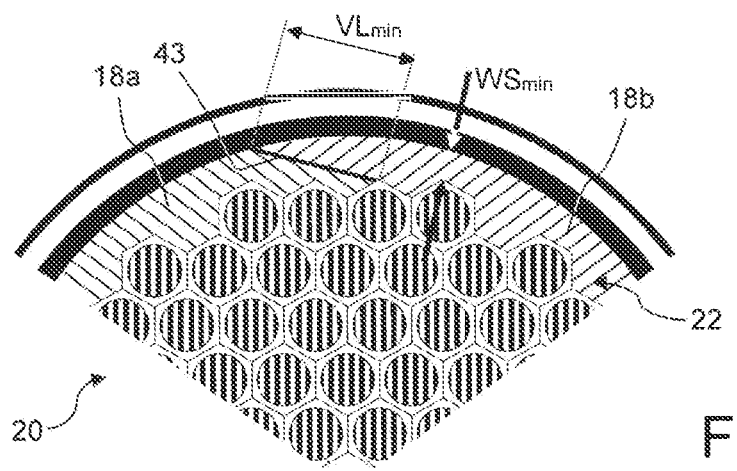
FIG. 10 shows schematically in cross section a detail of a finished conductor arrangement according to the invention, with filling elements which form a closed ring of filling elements, with diagonally extending joints.

FIG. 8 shows a variant of a finished conductor arrangement 20 for the invention in a schematic cross section, showing only a sector-shaped part of the finished conductor arrangement 20 (the latter is also true of FIG. 9 and FIG. 10).

In the case of the variant shown in FIG. 8, the tips 16 of the subelements 1a that project the furthest radially combine with the outer, round profiles 24 of the filling elements 18a, 18b to form a contour 40 in the shape of a circular arc; this is the circular arc-shaped contour 40 having the smallest possible radius which runs through a maximum number of tips 16 and at the same time includes all of the subelements 1a. The filling elements 18a, 18b which follow one another in the peripheral direction, which in this case have an alternating geometry, are separated from one another by tips 16 in each case. This structural form is particularly compact, and achieves a particularly high areal fraction of Nb3Sn in the eventual Nb3Sn superconductor wire.

In the structural form shown, a tubular intermediate structure 41 is arranged between the outer tube 19 and the filling elements 18a, 18b. This tubular intermediate structure 41 is fabricated here from a material which blocks or at least hinders the diffusion of Sn from the inside to the outside, toward the outer tube 19; for this purpose, the intermediate structure is made preferably of Nb, Ta or V or of an alloy based on these elements.

The variant shown in FIG. 9 of a finished conductor arrangement 20 for the invention has filling elements 18a, 18b which form a surrounding ring 22 of filling elements. The minimal wall thickness $WS_{min}$ of the filling element ring 22 in the radial direction is here approximately the same size as the edge length $KL_{sub}$ of a subelement 1a, i.e., $WS_{min}=KL_{sub}$. Through sufficiently large minimal wall thicknesses of the filling element ring 22 it is possible to ensure that the ring is able to take on a function in the finished conductor arrangement, such as an additional hindrance to the diffusion of Sn radially outward (for which the filling element material must be selected accordingly), or else for a favorable—mediating, for example—deformation behavior.

In the embodiment shown in FIG. 9, the joint 42 between the filling elements 18a, 18b is oriented radially, which makes the filling element ring 22 particularly simple to fabricate.

In a finished conductor arrangement 20 in accordance with the invention it is also possible, however, to set up a joint 43 which extends diagonally to the radial direction RR at between filling elements 18a, 18b of a filling element ring 22 that are adjacent in the peripheral direction, as shown in FIG. 10. The diffusion of Sn can proceed more rapidly at joints, in general, than through solid material. By setting up a diagonal joint 43 it is possible to extend the length of the joint 43, and hence to retard the diffusion along the joint 43. In the variant shown, the smallest length of extent $VL_{min}$ of all the joints 43 in the finished conductor arrangement 20 is around 5 times as long as the smallest radial wall thickness $WS_{min}$ in the filling element ring 22, i.e., $VL_{min}=5*WS_{min}$.

Figure 11:
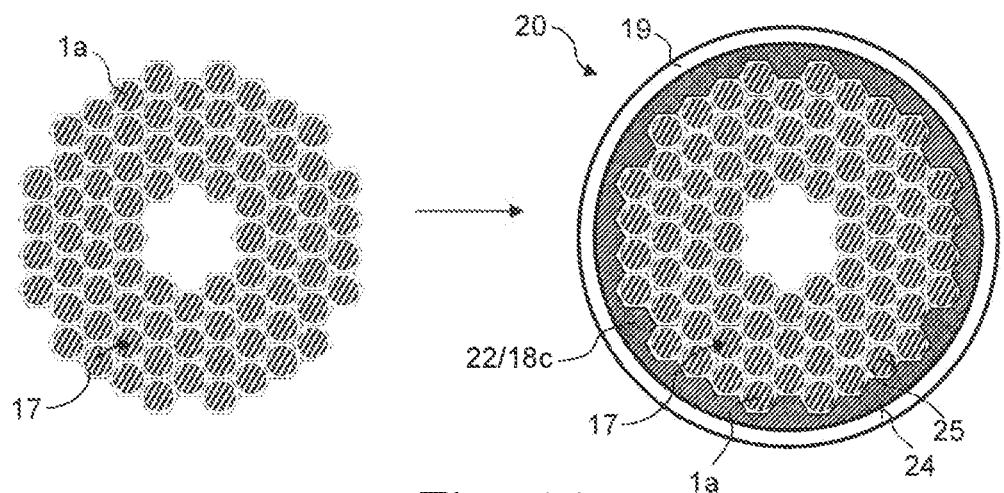
FIG. 11 shows schematically the production of a finished conductor arrangement according to the invention, in cross-sectional views, where the subelements are inserted into an individual filling element.

FIG. 11 illustrates the assembly of a finished conductor arrangement 20 in accordance with the invention, where the bundled, mutually abutting subelements 1a are introduced into a single, surrounding filling element 18c, which on the outside has a surrounding, round profile 24 and on the inside has a serrated profile 25 corresponding to the outer contour of the entirety 17 of the subelements 1a. Accordingly, the filling element 18c also forms a closed filling element ring 22. The filling element 18c here is arranged directly on the inside of an outer tube 19, to give the finished conductor arrangement 20.

It is the case that the fabrication of the individual filling element 18c is more difficult than the fabrication of a set of filling elements which together surround the entirety 17 of the filling elements 1a; however, combining the subelements 1a with the filling element 18c is simpler, since there is no need to work with a plurality of filling elements at the same time. Moreover, joints between filling elements, which can form a rapid diffusion pathway for Sn, are avoided.

Figure 12:
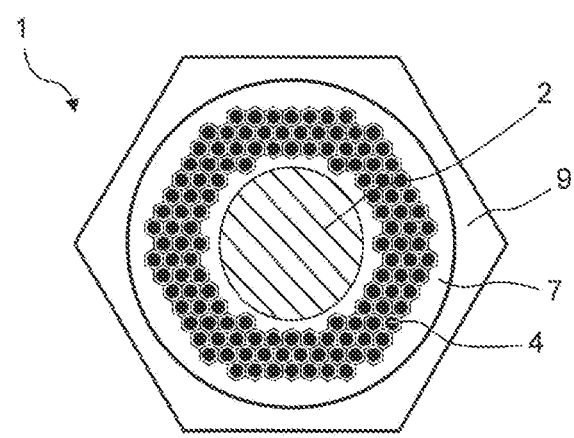
FIG. 12 shows schematically in cross section a subelement for the invention, where the remaining parts of the subelement have been inserted into a casing structure, the subelement being configured without a diffusion barrier.

FIG. 12 shows a subelement 1 for the invention wherein the casing structure 9 on the inside directly abuts the outer matrix 7 surrounding the Nb-containing rod elements 4. Here, a unified insert part composed of Sn-containing core 2, inner matrix 3, Nb-containing rod elements 4, and outer matrix 7 has been inserted into the casing structure 9, which has an externally hexagonal and internally round configuration.

This structural form does not have a diffusion barrier. As a result, a higher areal fraction of Nb3Sn can be obtained in the completed Nb3Sn superconductor wire; at the same time, however, the reactive annealing ought to be conducted in such a way that the diffusion of Sn from the Sn-containing core 2 proceeds as little as possible beyond the region of the Nb-containing rod elements 4. In the context of the invention, effective control is achievable via the shape of the subelements 1, in the case both of a reshaping of the subelements 1 with a reduction in cross section, and of a reshaping of the finished conductor arrangement with a reduction in cross section, and so control of the diffusion of Sn via the process regime during the reactive annealing is possible in principle without diffusion barriers.

For greater reliability, however, it is possible to provide diffusion barriers in the region of the outer structure of the finished conductor arrangement (for instance, an additional structure hindering Sn diffusion, or else a filling element ring which hinders Sn diffusion; cf. FIG. 4 and FIG. 8 and FIG. 9), especially if the use to which the Nb3Sn superconductor wire is put necessitates severe bending of the finished conductor arrangement (and hence uneven distortions in the cross section of the wire), such as when laying cables or when winding coils, for instance.

Figure 13:
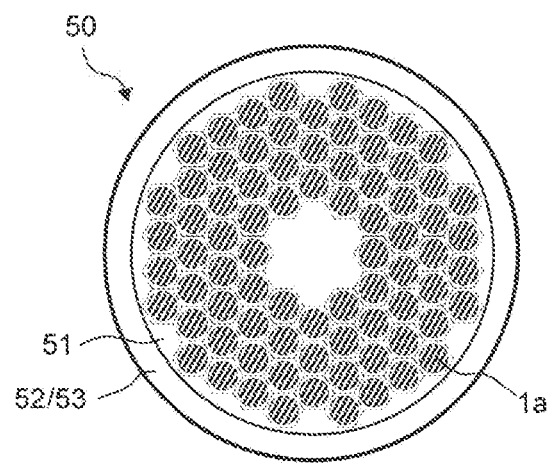
FIG. 13 shows in schematic cross section a simple finished conductor arrangement in which subelements produced in accordance with the invention have been installed.

If a sufficient boost to current-carrying capacity and reliability in relation to possible Sn contamination of regions which are highly conductive (under normal conduction) is already achieved as a result of the externally hexagonal and internally round casing structure into which the remaining parts of the subelement are inserted, it is also possible to select a simpler construction of a finished conductor arrangement 50, in which no filling elements are used; cf. FIG. 13. Here, the bundled subelements 1a are inserted directly into outer tube 52 with a round internal cross section, and free spaces (voids) 51 remain around the subelements 1a. In this case the outer tube 52 forms the outer structure 53 of the finished conductor arrangement 50.

Figure 14:
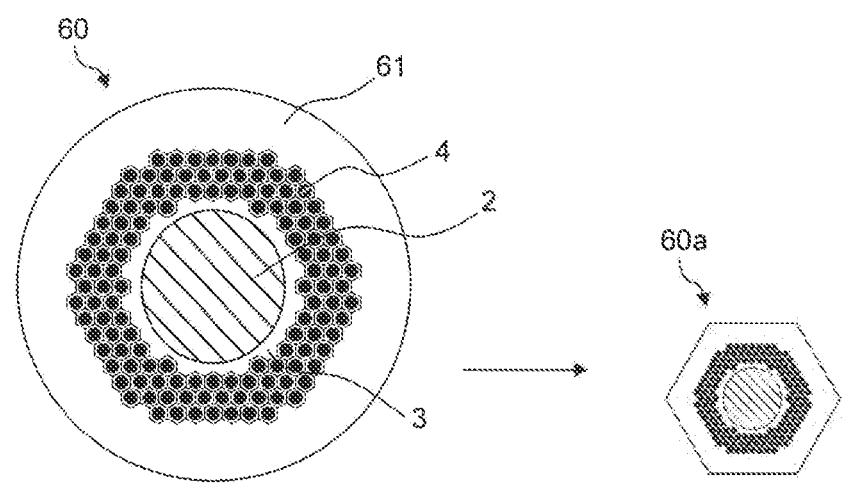
FIG. 14 shows in a schematic cross section a simple subelement which can be installed in a finished conductor arrangement of the invention, and the reshaping of the subelement with reduction in cross section.

If a sufficient boost to current-carrying capacity and reliability in respect of any Sn contamination of regions which are highly conductive (under normal conduction) is achieved simply through the use of filling elements around the subelements in the finished conductor arrangement, then it is also possible to select a simpler construction of a subelement 60; cf. FIG. 14. In this case the Nb-containing rod elements 4 are surrounded merely by an externally round, outer matrix 61. In the course of the reshaping with reduction in cross section, a hexagonal outer form is then imposed on the outer matrix 61; cf. the reshaped (drawn) subelement 60a.

Figure 15:
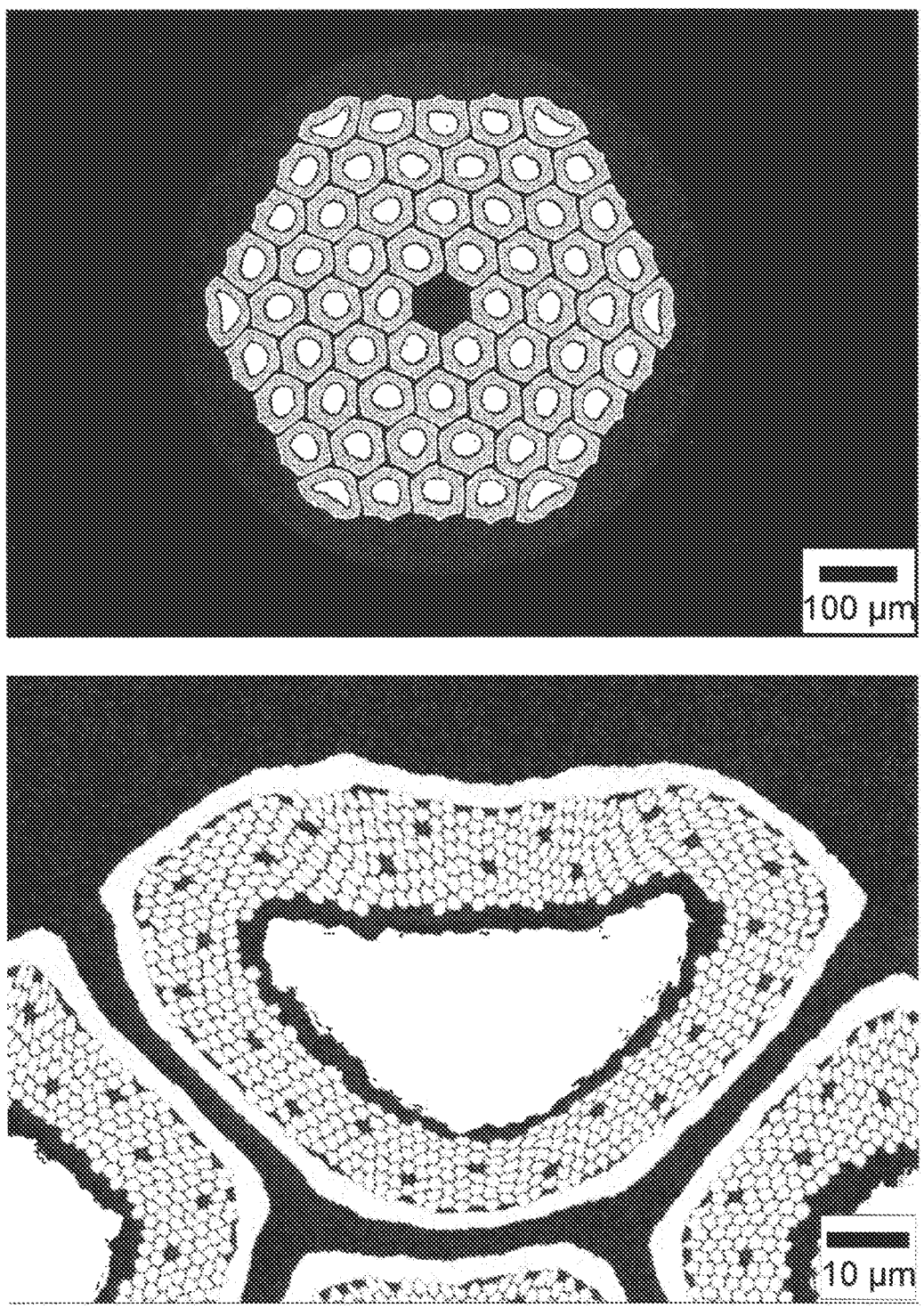
FIG. 15 shows a scanning electron micrograph of a ground section of a finished conductor arrangement according to the prior art after reshaping with reduction in cross section, with an overview micrograph (top) and an enlarged detail (bottom)

FIG. 15 shows, illustratively, a finished conductor arrangement after a reshaping with reduction in cross section in accordance with the prior art. In the fabrication process, RRP subelements in a hexagonal arrangement were inserted into an outer structure having a hexagonal internal cross section. Beforehand, the RRP elements were reshaped from a round cross section to a hexagonal cross section in a reshaping with reduction in cross section.

In the overview micrograph (top) it is readily apparent that the marginal RRP subelements, and especially those positioned at corners, are greatly deformed. The deformation of the corner subelements is so substantial as to produce an approximately triangular architecture for the Sn-containing core (light region in the middle of each subelement). In the enlargement (bottom) of a typical corner subelement, it is also possible to see that a large part of the Nb-containing subelements undergo deformation which causes the respective cross section to become approximately oval, producing an average aspect ratio estimated at around 1.5 to 2, and that a much greater aspect ratio of up to around 3 is obtained for a not inconsiderable proportion of the Nb-containing rod elements as well (especially above the upper corners of the triangular Sn-containing core). There are sharp variations in the "radial" thickness of the region of abutting Nb-containing rod elements and also in the thickness of the diffusion barrier (light in the figure, arranged around the region of the Nb-containing rod elements).

Figure 16:
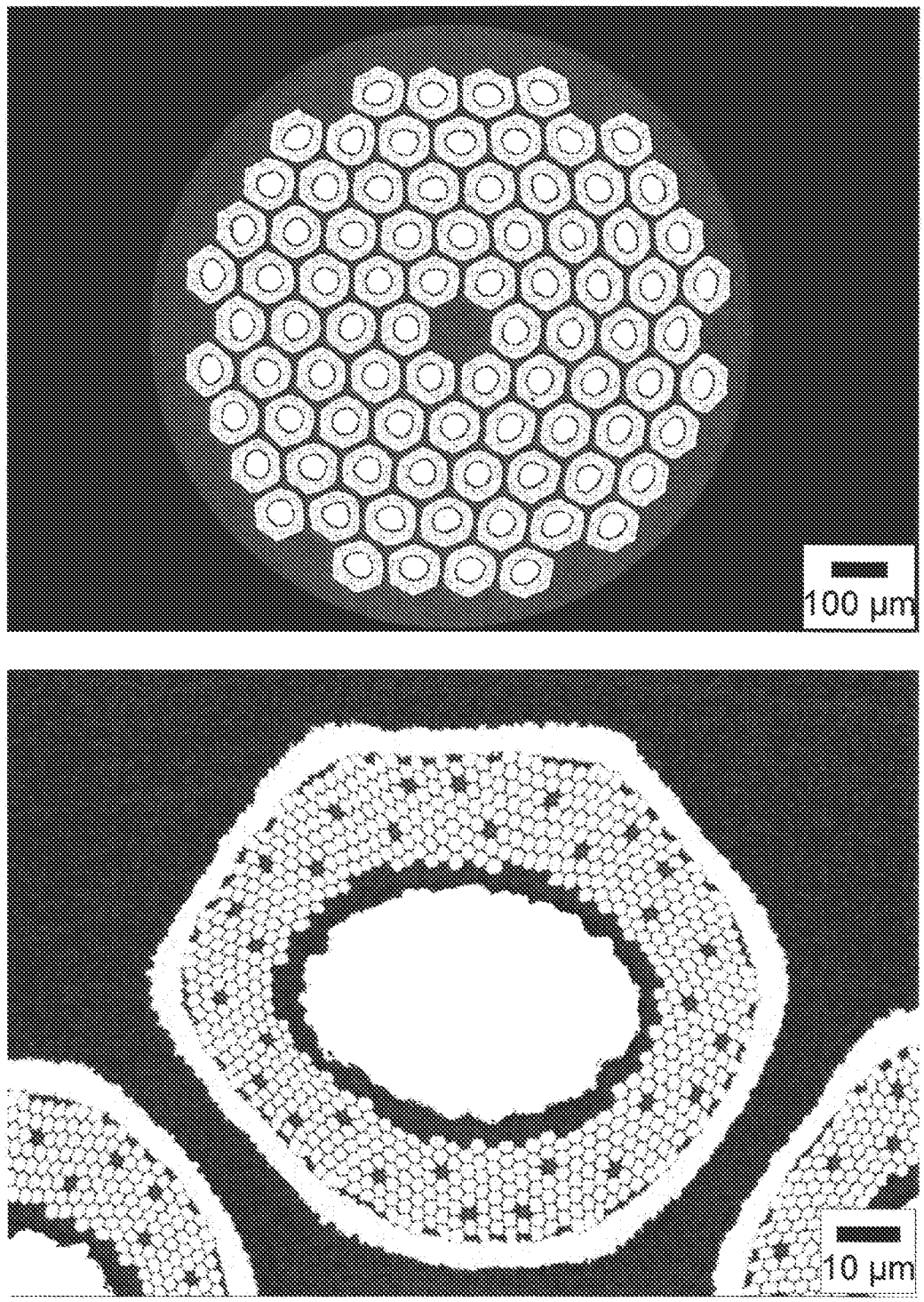
FIG. 16 shows a scanning electron micrograph of a ground section of a finished conductor arrangement according to the invention after reshaping with reduction in cross section, where RRP subelements in an arrangement with an approximately circular overall profile have been supplemented with filling elements, with an overview micrograph (top) and an enlarged detail (bottom)

FIG. 16 shows a finished conductor arrangement according to the invention after reshaping with reduction in cross section, where RRP subelements in an arrangement with an approximately circular overall profile have been supplemented with filling elements and inserted into an outer tube having a round internal cross section. Beforehand, the RRP elements were reshaped from a round cross section to a hexagonal cross section in the course of a reshaping with reduction in cross section.

As a result of the use of the filling elements, relative to the prior art, the deformation of the marginal RRP subelements and especially of those in corner positions is much reduced, as readily apparent both in the overview micrograph (top) and in the enlargement (bottom) of a typical corner subelement. As can be seen in the enlargement (bottom), there is only slight oval distortion to the Sn-containing core. The individual Nb-containing rod elements are to a large degree not markedly deformed; the Nb-containing rod elements have an average aspect ratio estimated at around 1.1 to 1.2, and for individual Nb-containing rod elements there is also an aspect ratio of up to around 1.5. The "radial" thickness of the region of Nb-containing rod elements, and the thickness of the diffusion barrier (light in the figure), vary substantially in accordance with the hexagonal form imposed.

Figure 17:
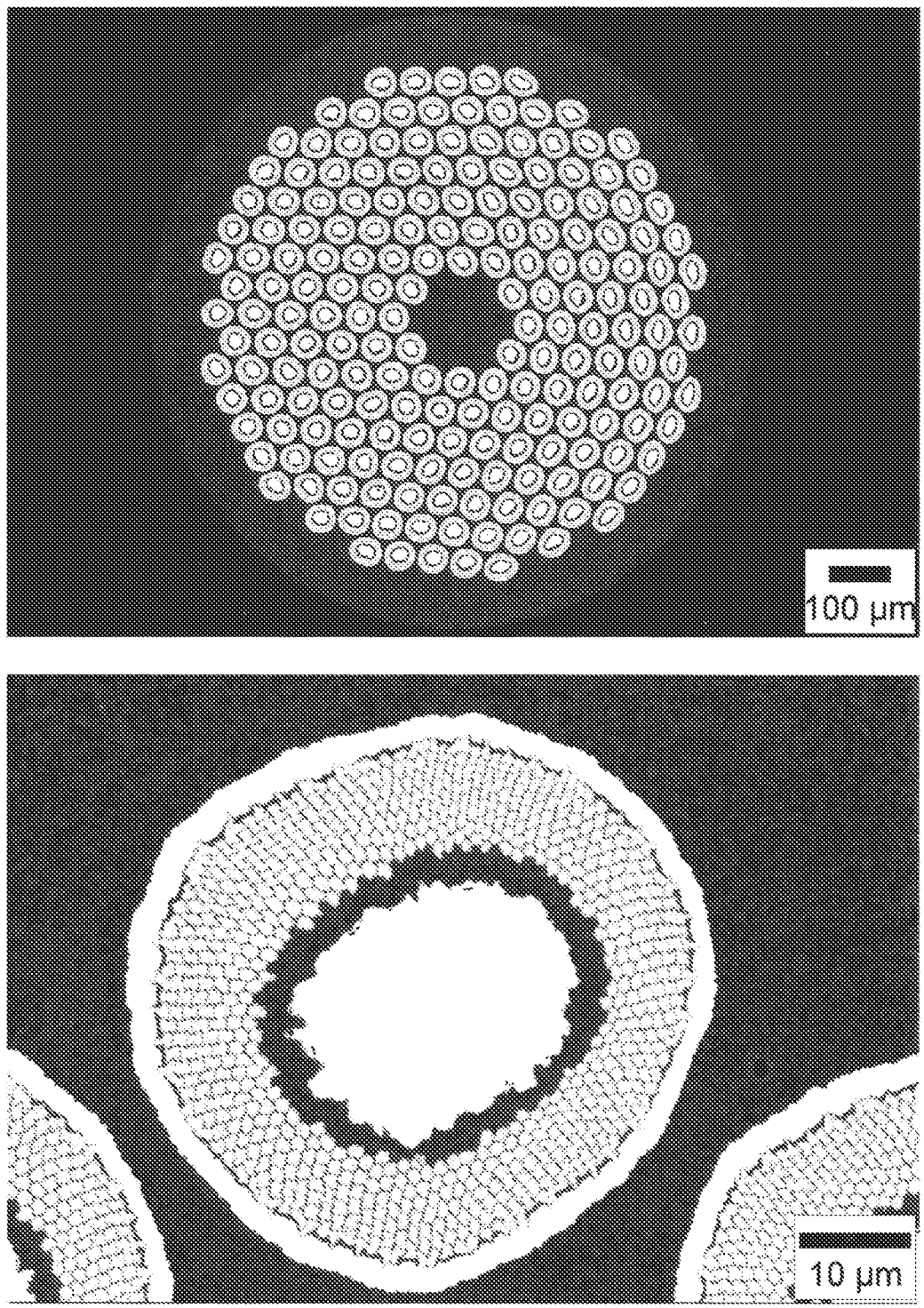
FIG. 17 shows a scanning electron micrograph of a ground section of a finished conductor arrangement according to the invention after reshaping with reduction in cross section, where RRP subelements in an arrangement with an approximately circular overall profile have been supplemented with filling elements, and for which, with regard to the RRP subelements, the remaining subelement has been inserted in each case into an externally hexagonal and internally round casing structure, with an overview micrograph (top) and an enlarged detail (bottom).

FIG. 17, lastly, shows a finished conductor arrangement according to the invention after reshaping with reduction in cross section, where RRP subelements in an arrangement with an approximately circular overall profile have been supplemented with filling elements and inserted into an outer tube with a round internal cross section, and where the remaining subelement among the RRP subelements has been inserted into an externally hexagonal and internally round casing structure.

Through the use of the filling elements, here as well, relative to the prior art, a much smaller deformation of the marginal RRP subelements, and especially those positioned at the corners, is achieved, this being readily apparent both in the overview micrograph (top) and in the enlargement (bottom) of a typical corner subelement. The Sn-containing core remains approximately circular. Through the use of an externally hexagonal and internally round casing structure to be filled, for a respective RRP subelement, it is possible to minimize the deformation of the Nb-containing rod elements in the course of the subsequent reshaping of the respective RRP subelements with reduction in cross section. Correspondingly, in the finished conductor as well, there is virtually no deformation in the cross section of the individual Nb-containing rod elements. The "radial" thickness of the region of Nb-containing rod elements and also the thickness of the diffusion barrier vary only slightly, corresponding to the small uneven deformation of the RRP subelement.

In summary the invention proposes, in connection with the production of an Nb3Sn superconductor wire (33)

according to the RRP principle, to use a finished conductor arrangement (20; 50) wherein hexagonal RRP subelements (1a; 60a) are grouped to form a bundle having an approximately circular cross section and are arranged together with filling elements (18a-18c) in an internally and externally round outer tube (19; 52). To the inside the filling elements (18a-18c) form a serrated profile (25) for abutment against the hexagonal subelements (1a; 60a), and to the outside they form a round profile (24) for direct or indirect abutment in the outer tube. As a result, during a reshaping of the finished conductor arrangement (20, 50) with a reduction in cross section, uneven deformations, more particularly dents, to the subelements (1a, 60a) are minimized. In connection with the fabrication of the RRP subelements (1; 60), the invention proposes fabricating them, before a reshaping with a reduction in cross section, with an externally hexagonal and internally round casing structure (9) into which the remaining parts of the subelements (1; 60) are inserted, more particularly an annular arrangement of hexagonal Nb-containing rod elements (4), which are surrounded externally by an outer matrix (7, 61) and internally by an inner matrix (3). During a subsequent reshaping of the subelements (1; 60) with a reduction in cross section, again, uneven deformations, more particularly azimuthal redistributions of material, are minimized. Overall it is possible to achieve an Nb3Sn superconductor wire (33) with a high superconducting current-carrying capacity and a minimized risk of Sn contaminations in regions of normal conduction, and hence with a good protective function in the event of quenching.

LIST OF REFERENCE SYMBOLS 1 (unreshaped) subelement
1b (reshaped) subelement
2 Sn-containing core
3 inner matrix
4 Nb-containing rod element
5 Nb-containing core filament
6 Cu-containing filament casing
7 outer matrix
8 diffusion barrier
9 casing structure
10 unified insert part
11 corner of hexagon
12 longitudinal side of hexagon
13 central structure
14 central element
15 circumscribing circle
16 tip
17 entirety of the subelements
18 entirety of the filling elements
18a-b filling elements
18c (single) filling element
19 outer tube
20 (unreshaped) finished conductor arrangement
20a (reshaped) finished conductor arrangement
21 outer structure
22 ring of filling elements
23 joint
24 round profile
25 serrated profile
30 winding body
31 coil
32 oven
33 Nb3Sn superconductor wire
40 circular arc-shaped contour
41 intermediate structure
42 joint
43 diagonal joint
50 finished conductor arrangement (without filling elements)
51 free space
52 outer tube
53 outer structure
60 (unreshaped) subelement (without externally hexagonal and internally round casing structure)
60a (reshaped) subelement (without externally hexagonal and internally round casing structure)
61 outer matrix
DM diameter of core filament
$KL_{sub}$ edge length of a hexagonal subelement
$VL_{min}$ smallest length of extent of diagonal joint
WF (smallest) wall thickness of filament casing
$WS_{min}$ minimal wall thickness of filling element ring

What is claimed is:

1. A finished conductor arrangement for an Nb3Sn superconductor wire, comprising
a plurality of mutually abutting subelements each comprising Nb and Sn and each being configured hexagonally in external cross section, and
an outer structure which comprises Cu and which surrounds the mutually abutting subelements, the outer structure being configured to be round in external cross section,
where the subelements are each configured with
an Sn-containing core,
an inner matrix which comprises Cu and which surrounds the Sn-containing core,
a region of mutually abutting Nb-containing rod elements, which are each configured hexagonally in external cross section, and
an outer matrix which comprises Cu and surrounds the region of Nb-containing rod elements;
where the outer structure is configured with an outer tube which is configured to be round in radially external cross section and in radially internal cross section,
where between the outer tube and the mutually abutting subelements, one or more filling elements are arranged which on a radially outer side have a round profile for direct or indirect abutment against a radially inner side of the outer tube, and which radially to the inner side have a serrated profile for abutment against the mutually abutting subelements,
where the one or more filling elements abut the mutually abutting subelements on the outer side, and the outer tube abuts the radially outer, round profile of the one or more filling elements directly or indirectly, and
where an entirety of the filling elements, radially toward the inner side, form an approximately circular overall profile.

2. The finished conductor arrangement as claimed in claim 1, wherein the one or more filling elements form a surrounding filling element ring within which an entirety of the mutually abutting subelements are arranged.

3. The finished conductor arrangement as claimed in claim 2, wherein the filling element ring comprises a plurality of the filling elements, and wherein joints between the filling elements adjacent in a peripheral direction in the filling element ring extend at least partially diagonally with respect to a radial direction.

4. The fabricated conductor arrangement as claimed in claim 3, wherein the joints between the filling elements adjacent in the peripheral direction in the filling element ring extend completely diagonally with respect to the radial direction.

5. The fabricated conductor arrangement as claimed in claim 3, wherein a smallest length of extent $VL_{min}$ of all the lengths of extent of the respective joints is conditioned as follows: $VL_{min} \geq 2*WS_{min}$, where $WS_{min}$ is a minimal radial wall thickness of the filling element ring.

6. The finished conductor arrangement as claimed in claim 2, wherein the filling elements of the filling element ring are fabricated from a material which is suitable for blocking or hindering diffusion of Sn from the subelements into the outer tube during a reactive heat treatment wherein the Nb and Sn from the subelements react to form Nb3Sn.

7. The fabricated conductor arrangement as claimed in claim 2, wherein a minimal radial wall thickness $WS_{min}$ of the filling element ring is conditioned as follows: $WS_{min} \geq 0.3*KL_{sub}$, where $KL_{sub}$ is an edge length of a hexagonal subelement.

8. The finished conductor arrangement as claimed in claim 1, wherein the one or more filling elements comprise Cu.

9. The finished conductor arrangement as claimed in claim 1, wherein the one or more filling elements comprise a plurality of the filling elements having different geometries.

10. The fabricated conductor arrangement as claimed in claim 9, wherein the plurality of the filling elements comprise a total of twelve filling elements having two different geometries.

11. The finished conductor arrangement as claimed in claim 1, further comprising an intermediate structure radially between the inner side of the outer tube and the round profile of the one or more filling elements.

12. The finished conductor arrangement as claimed in claim 11, wherein the intermediate structure is fabricated from a material which is suitable for blocking or hindering diffusion of Sn from the subelements into the outer tube during a reactive heat treatment wherein the Nb and Sn from the subelements react to form Nb3Sn.

13. The finished conductor arrangement as claimed in claim 1, wherein the subelements are additionally configured with
a diffusion barrier, which radially surrounds the outer matrix, and
a casing structure which comprises Cu and which radially surrounds the diffusion barrier.

14. The finished conductor arrangement as claimed in claim 1, further comprising a central structure which is surrounded by the mutually abutting subelements, where the central structure is Cu-containing.

15. The fabricated conductor arrangement as claimed in claim 14, wherein the central structure comprises one or more central elements which are configured hexagonally in external cross section.

16. The finished conductor arrangement as claimed in claim 1, wherein the one or more filling elements comprise a plurality of the filling elements, and tips projecting radially furthest of an entirety of the mutually abutting subelements combine with the round profile of the filling elements to form a circular contour, with the filling elements being configured such that the circular contour has a minimal radius.

17. The fabricated conductor arrangement as claimed in claim 1, wherein the Nb-containing rod elements are each configured with an Nb-containing core filament and a Cu-containing filament casing.

18. A method for fabricating an $Nb_3Sn$-containing superconductor wire, comprising:
subjecting a finished conductor arrangement as claimed in claim 1 to a reshaping with a reduction in cross section;
bringing the reshaped finished conductor arrangement into a desired geometric form; and
subjecting the finished conductor arrangement, brought into form, to a reactive heat treatment wherein the Nb and Sn from the subelements react to form the Nb3Sn.

19. A method for fabricating an $Nb_3Sn$-containing superconductor wire, comprising:
subjecting a finished conductor arrangement as claimed in claim 1 to a reshaping with a reduction in cross section;
bringing the reshaped finished conductor arrangement into a desired geometric form; and
subjecting the finished conductor arrangement, brought into form, to a reactive heat treatment wherein the Nb and Sn from the subelements react to form the Nb3Sn,
wherein the subelements are configured with a casing structure which comprises Cu and against which the outer matrix is abutted directly or indirectly radially on the inner side,
wherein, for fabricating a respective subelement for the finished conductor arrangement, the casing structure is fabricated separately with a round internal cross section and a hexagonal external cross section, and the remaining parts of the subelement are subsequently inserted into the round internal cross section of the casing structure,
and wherein the respective subelements are subjected to a reshaping with a reduction in cross section and are bundled to form the finished conductor arrangement.

20. A method for producing a subelement for an Nb3Sn superconductor wire,
where the subelement comprises Nb and Sn and is configured hexagonally in external cross section,
and where the subelement is configured with
an Sn-containing core,
an inner matrix which comprises Cu and which surrounds the Sn-containing core,
a region of mutually abutting Nb-containing rod elements, which are each configured hexagonally in external cross section,
an outer matrix which comprises Cu and surrounds the region of Nb-containing rod elements,
a casing structure which comprises Cu and against which the outer matrix abuts directly or indirectly radially on an inner side;
wherein the casing structure is fabricated separately with a round internal cross section and a hexagonal external cross section,
and wherein the remaining parts of the subelement are subsequently inserted into the round internal cross section of the casing structure.

21. The method as claimed in claim 20, wherein at least the inner matrix, the region of mutually abutting Nb-containing rod elements and the outer matrix are first assembled into a unified insert part, and the unified insert part is inserted into the round internal cross section of the casing structure.

22. The method as claimed in claim 21, wherein the unified insert part also comprises the diffusion barrier.

23. The method as claimed in claim 21, wherein the unified insert part also comprises the Sn-containing core.

24. A method for producing an Nb3Sn-containing superconductor wire, comprising:

fabricating a plurality of subelements as claimed in claim 20;

subjecting the fabricated subelements to a reshaping with reduction in cross section;

bundling the reshaped subelements to form a finished conductor arrangement, where a plurality of the reshaped subelements are placed against one another and are surrounded radially by a Cu-containing outer structure;

subjecting the finished conductor arrangement to a reshaping with reduction in cross section;

bringing the reshaped finished conductor arrangement into a desired geometric form; and subjecting the finished conductor arrangement, brought into form, to a reactive heat treatment wherein the Nb and Sn from the subelements react to form the Nb3Sn.

25. The method as claimed in claim 24, wherein during the bundling to form the finished conductor arrangement, one or more filling elements are arranged between the outer structure, which comprises an outer tube having a round internal cross section and a round external cross section, and the mutually abutting subelements, where the filling elements radially outward have a round profile for direct or indirect abutment against an inside of the outer tube, and radially inward have a serrated profile for abutment against the mutually abutting subelements, and wherein an entirety of the filling elements radially toward the inner side form an approximately circular overall profile.

26. The method as claimed in claim 20, wherein the subelement is fabricated with a diffusion barrier which radially surrounds the outer matrix and which is abutted directly or indirectly against the casing structure radially on the inner side.

27. The method as claimed in claim 20, wherein the Nb-containing rod elements are each configured with an Nb-containing core filament and a Cu-containing filament casing.

\* \* \* \* \*